(12) United States Patent
Sauciuc et al.

(10) Patent No.: US 7,499,278 B2
(45) Date of Patent: Mar. 3, 2009

(54) METHOD AND APPARATUS FOR DISSIPATING HEAT FROM AN ELECTRONIC DEVICE

(75) Inventors: Ioan Sauciuc, Phoenix, AZ (US); Ward Scott, Chandler, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 587 days.

(21) Appl. No.: 11/229,227

(22) Filed: Sep. 16, 2005

(65) Prior Publication Data

US 2006/0005948 A1 Jan. 12, 2006

Related U.S. Application Data

(62) Division of application No. 09/897,793, filed on Jun. 29, 2001, now Pat. No. 6,971,442.

(51) Int. Cl.
*H05K 7/20* (2006.01)
*F28F 7/00* (2006.01)
*H01L 23/34* (2006.01)

(52) U.S. Cl. ............... 361/700; 361/699; 165/80.4; 165/104.29; 174/15.1; 257/714

(58) Field of Classification Search ............ 361/700
See application file for complete search history.

(56) References Cited

U.S. PATENT DOCUMENTS 3,776,304 A 12/1973 Victor
3,934,643 A 1/1976 Laing
4,026,348 A 5/1977 Roberts, Jr.
4,350,026 A 9/1982 Klein
4,470,450 A 9/1984 Bizzell et al.
5,203,399 A 4/1993 Koizumi
5,333,677 A 8/1994 Molivadas
5,587,880 A * 12/1996 Phillips et al. ............ 361/687
6,227,288 B1 5/2001 Gluck et al.
6,269,865 B1 8/2001 Huang
6,381,135 B1 4/2002 Prasher et al.

\* cited by examiner

*Primary Examiner*—Jayprakash N Gandhi
*Assistant Examiner*—Zachary M Pape
(74) *Attorney, Agent, or Firm*—Schwegman, Lundberg & Woessner, P.A.

(57) ABSTRACT

The method and apparatus of the present invention dissipate heat from an electronic device to provide an efficient and universally applied thermal solution for high heat generating electronic devices. The apparatus comprises an evaporator, a condenser, a heater and conduits. The evaporator, condenser, and conduits define a closed system that has an interior volume which is partially filled with a liquid coolant. The evaporator is thermally connected to an electronic device, such as a processor, and removes thermal energy from the processor by evaporating the liquid coolant. When the apparatus is oriented such that no liquid coolant is in contact with the evaporator, the heater applies thermal energy to the coolant until the coolant begins to boil. Boiling the liquid coolant causes bubbles to form within the liquid coolant. The volume of the bubbles generated by boiling raises the level of the liquid coolant within the closed system until the liquid coolant comes into contact with the evaporator. The evaporator is then able to evaporate the liquid coolant and remove thermal energy from the processor.

20 Claims, 5 Drawing Sheets

METHOD AND APPARATUS FOR DISSIPATING HEAT FROM AN ELECTRONIC DEVICE

This application is a divisional of U.S. patent application Ser. No. 09/897,793, filed on Jun. 29, 2001, now issued as U.S. Pat. No. 6,971,442, which is incorporated herein by reference.

TECHNICAL FIELD OF THE INVENTION

The present invention relates generally to the field of electronic devices, and in particular to the thermal management of high-powered processors.

BACKGROUND

Electronic devices generate heat during operation. Thermal management refers to the ability to keep temperature-sensitive elements in an electronic device within a prescribed operating temperature. Thermal management has evolved to address the increased heat generation created within such electronic devices as a result of increased processing speed/power of the electronic devices.

Historically, electronic devices were cooled by a natural convection thermal management technique. The cases or packaging of these prior art electronic devices were designed with openings (e.g., slots) strategically located to allow warm air to escape and cooler air to be drawn in.

The processing speeds of computer systems have recently climbed from 25 MHZ to more than 1000 MHZ. The advent of such high performance processors and electronic devices now requires more innovative thermal management. Each of these increases in processing speed and power generally carries a "cost" of increased heat generation such that natural convection is no longer sufficient to provide proper thermal management.

Several methods have been employed for cooling high performance electronic devices such as processors. One common method of cooling these types of processors is by attaching heat sinks to a processor. The heat sinks are typically used in combination with a fan that forces air to pass by the heat sinks and/or processor.

There are several problems with cooling systems that utilize some form of a heat sink and fan combination. One problem is that the fan must typically be located too closely to the fins of the heat sink to generate fully developed air flow. When a large fan is used in conjunction with a heat sink to cool an electronic component, a large percentage of the air moved by the system fan does not go through the heat sink. As a result, even large fans are not an efficient thermal solution for cooling some electronic devices.

Some of the new high performance cooling systems are utilizing multiple fans to maintain proper operating temperatures. However, the additional fans in multiple fan cooling systems adds unwanted expense to manufacturing such electronic devices. In addition, the additional fans are noisy, bulky and utilize an inordinate amount of space within the environment where the electronic device is located.

An alternative and more costly system to manage the thermal energy output of high-powered processors is a "single-phase" pumped liquid cooling system. The system uses a heat exchanger that is thermally connected to the processor. The heat exchanger draws thermal energy from the processor and heats up a liquid coolant which is passed through the heat exchanger. A pump transfers the liquid coolant through a second heat exchanger that draws the thermal energy from the liquid coolant. The liquid coolant leaves the second heat exchanger at a low enough temperature to cool the processor once the coolant cycles back to the first heat exchanger.

These single-phase cooling systems suffer from several drawbacks. One drawback is that the systems are inefficient. Another drawback is that the systems require the use of a pump. These pumps require maintenance and commonly break down or leak onto one or more of the electrical components.

The most recent trend has seen the use of "two-phase" cooling systems to cool high-powered processors. These "two phase" cooling systems include an evaporator that removes thermal energy from the processor. The thermal energy causes a coolant within the evaporator to turn from a liquid into a vapor (i.e., to evaporate).

The coolant is typically transferred through an expansion valve before the coolant enters the evaporator. The expansion valve reduces the pressure of the coolant and also the temperature to enhance the efficiency of the cooling system and allow for coolant temperatures that are different than what otherwise would normally be available.

The coolant also typically exits the evaporator into a compressor, or pump, that transports the coolant from the evaporator into a condenser. The coolant leaves the pump at a higher pressure and temperature such that as the coolant flows through the condenser, energy can be easily removed from the coolant to the local air causing any vaporized coolant to readily condense back to a liquid. Once the coolant is in liquid form, it can be transported back to the evaporator after passing through the expansion valve.

These two-phase cooling systems also require the use of a pump such that they suffer from many of the drawbacks of single-phase systems. If these types of cooling systems are operated without using a pump, there could be problems depending on the orientation of the cooling system. In some orientations gravity forces the liquid coolant away from the evaporator making it impossible for the evaporator to cool the processor through evaporation of the coolant.

Since existing two-phase pumpless cooling systems do not effectively cool high performance processors under certain operating conditions, what is needed is a two-phase cooling system that provides high performance cooling under a variety of operating conditions for electronic components with high power generation.

DETAILED DESCRIPTION

Figure 1:
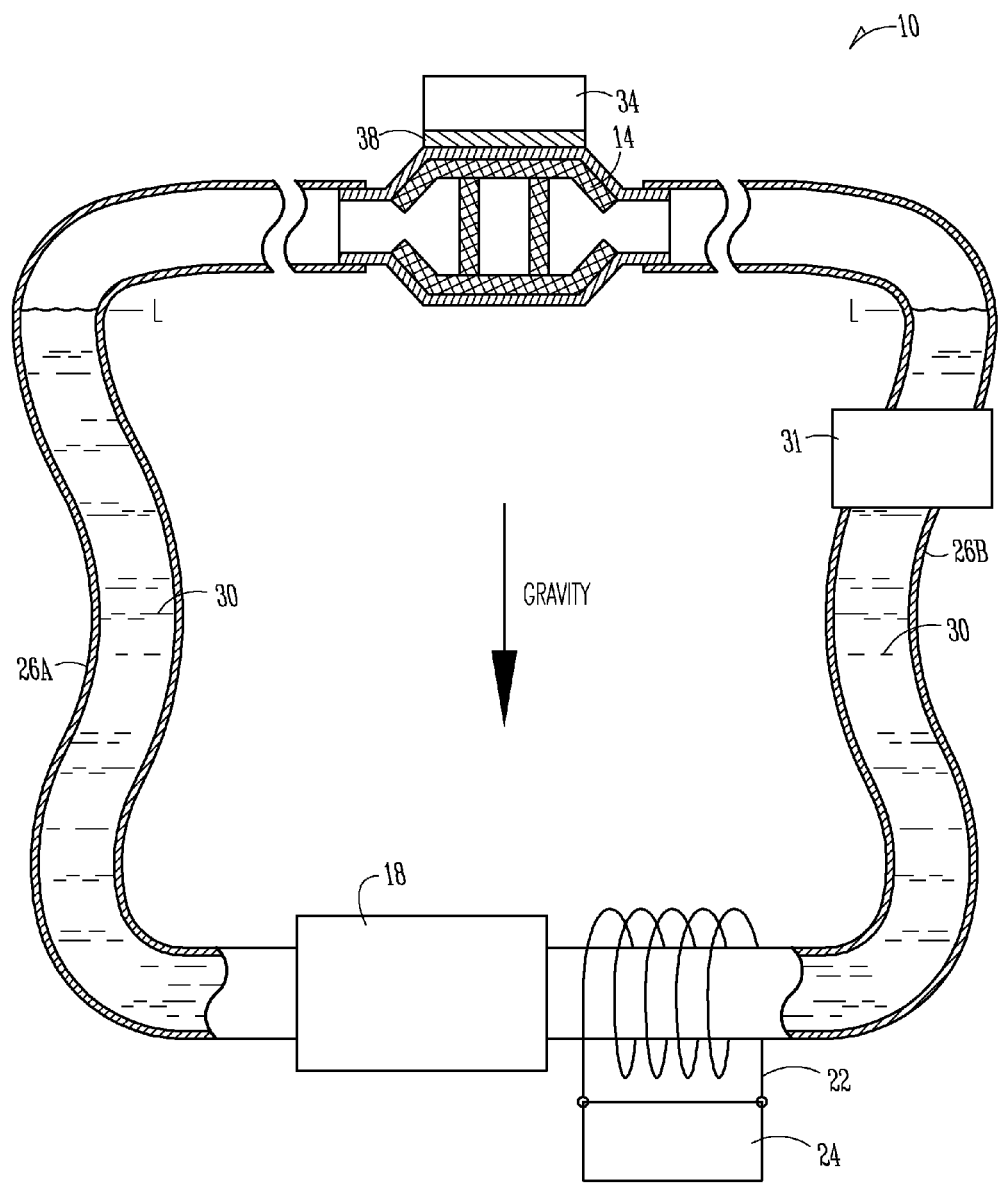
FIG. 1 is a schematic view illustrating an apparatus for dissipating heat from an electronic device where the apparatus is oriented such that gravity forces a liquid coolant within the apparatus away from an evaporator within the apparatus.

In the following detailed description of the invention reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention.

A method and apparatus for dissipating heat from an electronic device is described. The method and apparatus efficiently dissipate the heat that is generated by high performance processors.

FIGS. 1-4 are schematic views illustrating a two-phase apparatus 10 for dissipating heat from an electronic device such as processor 34. The apparatus 10 shown in FIGS. 1-4 comprises an evaporator 14, a condenser 18, a heater 22 and conduits 26A, 26B.

The evaporator 14, condenser 18, and conduits 26A, 26B define a closed system that has an interior volume which is partially filled with a coolant 30. The interior volume is partially filled because the apparatus must function as a two-phase device. A vacuum is preferably generated within the closed system before the coolant 30 is added to apparatus 10. Adding the coolant 30 when the interior of the closed system forms a vacuum results in there being only liquid and vapor coolant 30 within the closed system.

The coolant 30 circulates through the conduits 26A, 26B between the evaporator 14 where the liquid coolant 30 is evaporated and the condenser 18 where any vaporized coolant 30 is condensed. The evaporator 14 is thermally connected to the processor 34 in order to remove thermal energy from the processor 34 during operation of the processor 34.

FIG. 1 illustrates a situation where the electronic device in which the apparatus 10 is located is oriented such that gravity forces the liquid coolant 30 within the apparatus 10 away from the evaporator 14. The level L of the liquid coolant 30 within the closed system is not high enough to position a supply of the liquid coolant 30 within the evaporator 14. This situation is potentially damaging to the processor 34 because if the evaporator 34 is unable to evaporate (i.e., cool) the liquid coolant 30, the cooling system will not adequately remove the thermal energy that is being generated by the processor 34.

Figure 2:
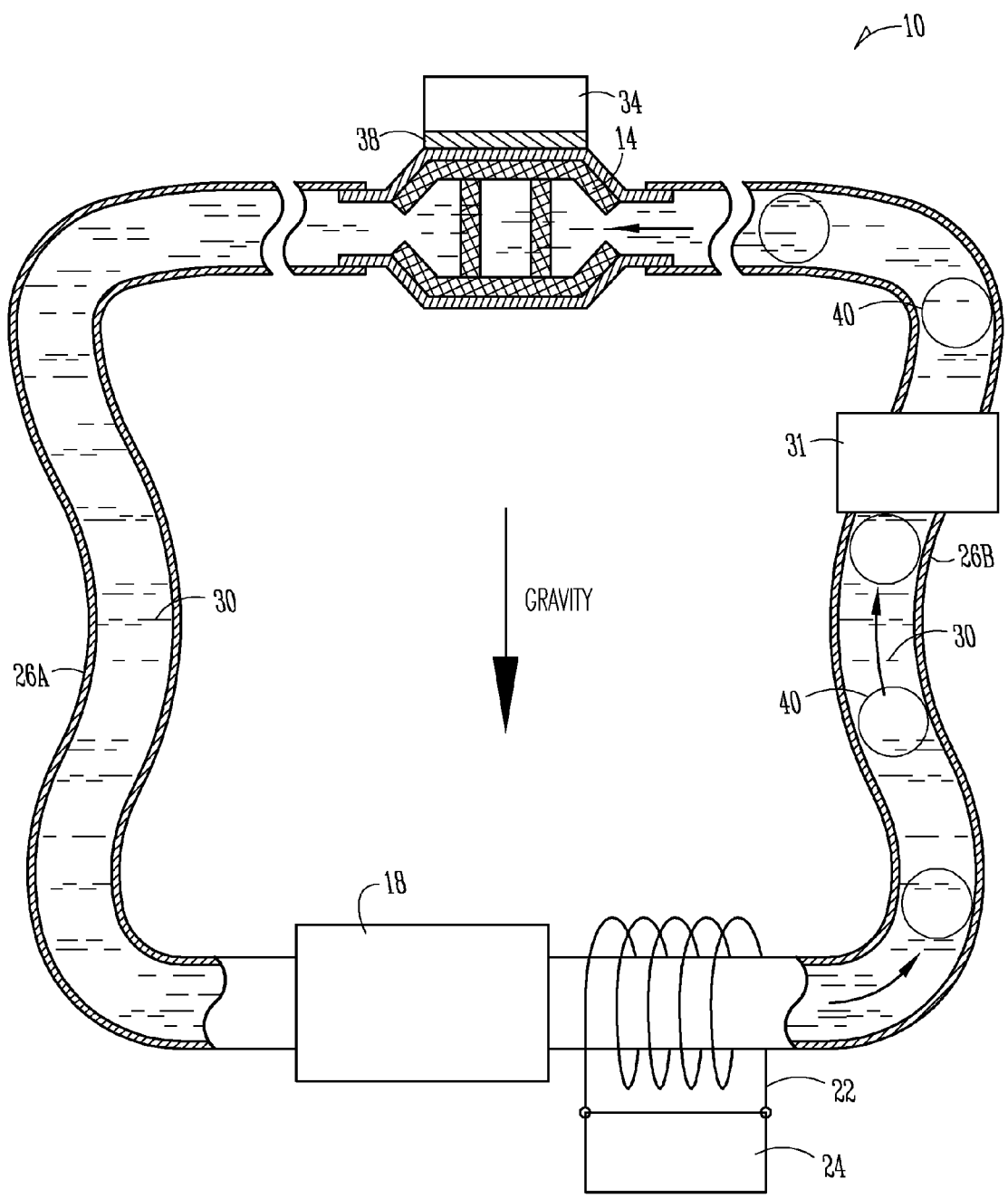
FIG. 2 is a schematic view of the apparatus shown in FIG. 1 where the use of a heater in the apparatus has caused the liquid coolant to come into contact with the evaporator.

FIG. 2 illustrates how the apparatus 10 shown in FIG. 1 solves this potentially damaging problem without the use of an expensive and unreliable pump. A control 24 directs the heater 22 to apply thermal energy to the coolant 30 until the coolant 30 begins to boil. Boiling the coolant 30 causes bubbles 40 to form within the coolant 30. The bubbles 40 are initially formed near the heater 22 on the interior wall of the conduit 26B. The bubbles 40 continue to expand until they eventually break from the interior wall of the conduit 26B. The bubbles 40 flow toward an area of lower pressure within the closed system. The pressure drops (i.e., the alternating areas of low and high pressure) are formed within the closed system based on the temperature differences within the system and the physical geometry of the system.

The initial direction of travel of the bubbles 40 is of minor importance because it is the volume of the bubbles 40 generated by boiling that raises the level L of the liquid coolant 30 within the closed system. Once a sufficient volume of bubbles 40 is generated by the heater 22, the liquid coolant 30 within the closed system comes into contact with the evaporator 14. The evaporator 14 is then able to evaporate the liquid coolant 30 and remove thermal energy from the processor 34.

In one form of the invention, the control 24 is a manually-operated switch that is manipulated by an operator to turn the heater 22 on and off. The control 24 may also include sensors (not shown) that monitor whether there is any coolant within the evaporator 14. The sensors provide data to the control 24 which automatically activates the heater 22 when the sensor data indicates that there is no coolant 30 within the evaporator 14. A portion of the control 24 may also be part of the processor 34 itself such that the evaporator 14 in effect cools the control 24.

Figure 3:
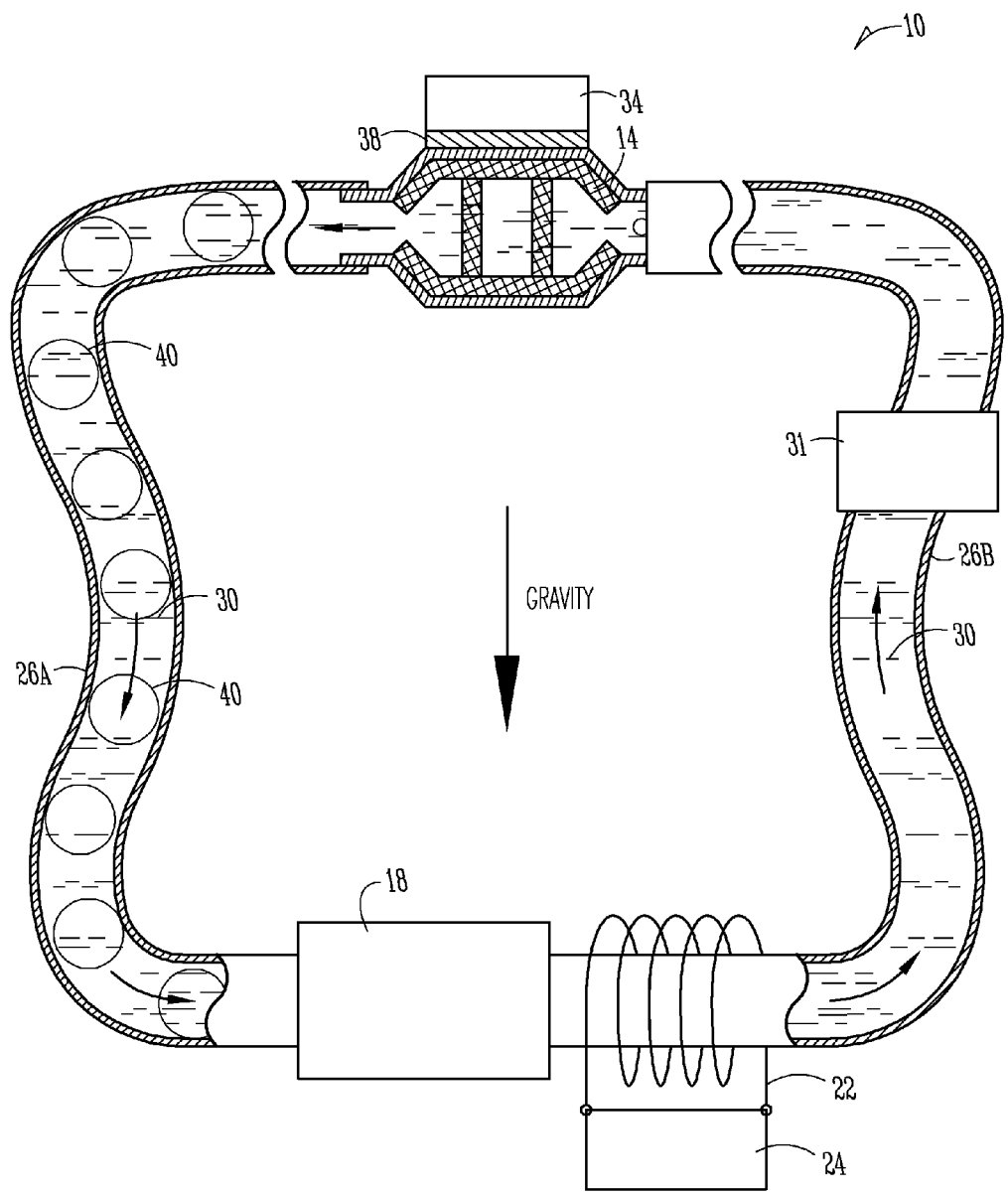
FIG. 3 is a schematic view of the apparatus shown in FIGS. 1 and 2 after the evaporator has begun cooling a processor.

FIG. 3 illustrates the apparatus 10 shown in FIGS. 1 and 2 after the evaporator 14 has begun cooling the processor 34. The evaporator 14 transforms the liquid coolant 30 into a vapor during the evaporation process. The coolant 30 that is vaporized within the evaporator 14 is condensed back into a liquid as the coolant 30 cycles through the condenser 18.

Once the evaporator 14 begins cooling the processor 34, the control 24 either turns off the heater 22 or uses the heater 22 to maintain the liquid coolant 30 at an optimum temperature for evaporation by the evaporator 14. The control 24 may also utilize a timer that turns off the heater 22 and or the electronic device after a certain period of time. The control 24 may also comprise a temperature sensor that indicates when the processor is inactive. During an extended period of inactivity, the control 24 may shut down the heater 22. In addition, the temperature sensor may detect when the processor 34 is operating at a dangerously high temperature. When the control 24 detects that the processor is operating at too high of a temperature, the control 24 to shuts down the electronic device before the processor 34 is damaged.

Figure 4:
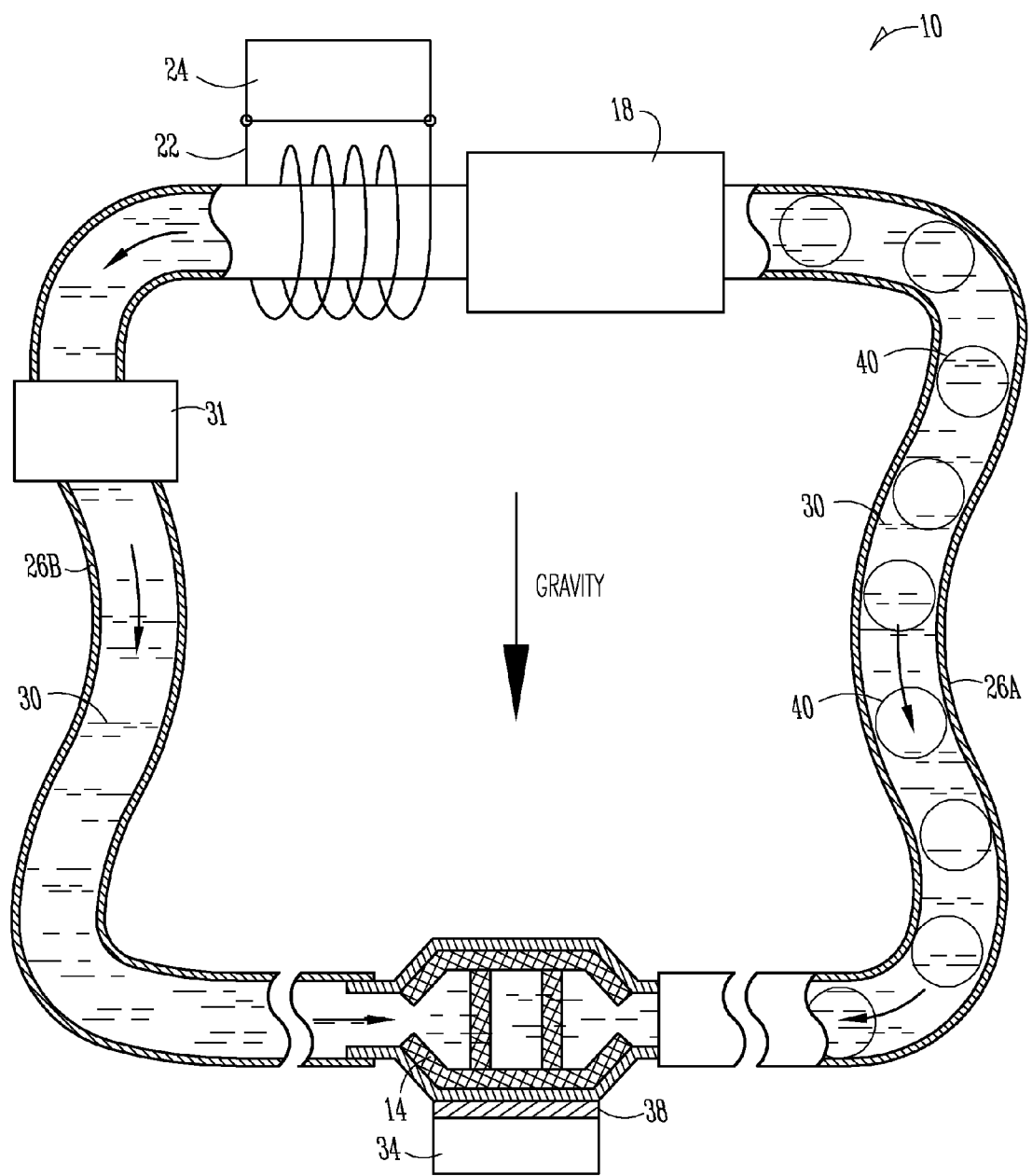
FIG. 4 is a schematic view of the apparatus shown in FIGS. 1, 2 and 3 where the apparatus is oriented such that gravity forces the liquid coolant within the apparatus into contact with the evaporator within the apparatus.
Figure 5:
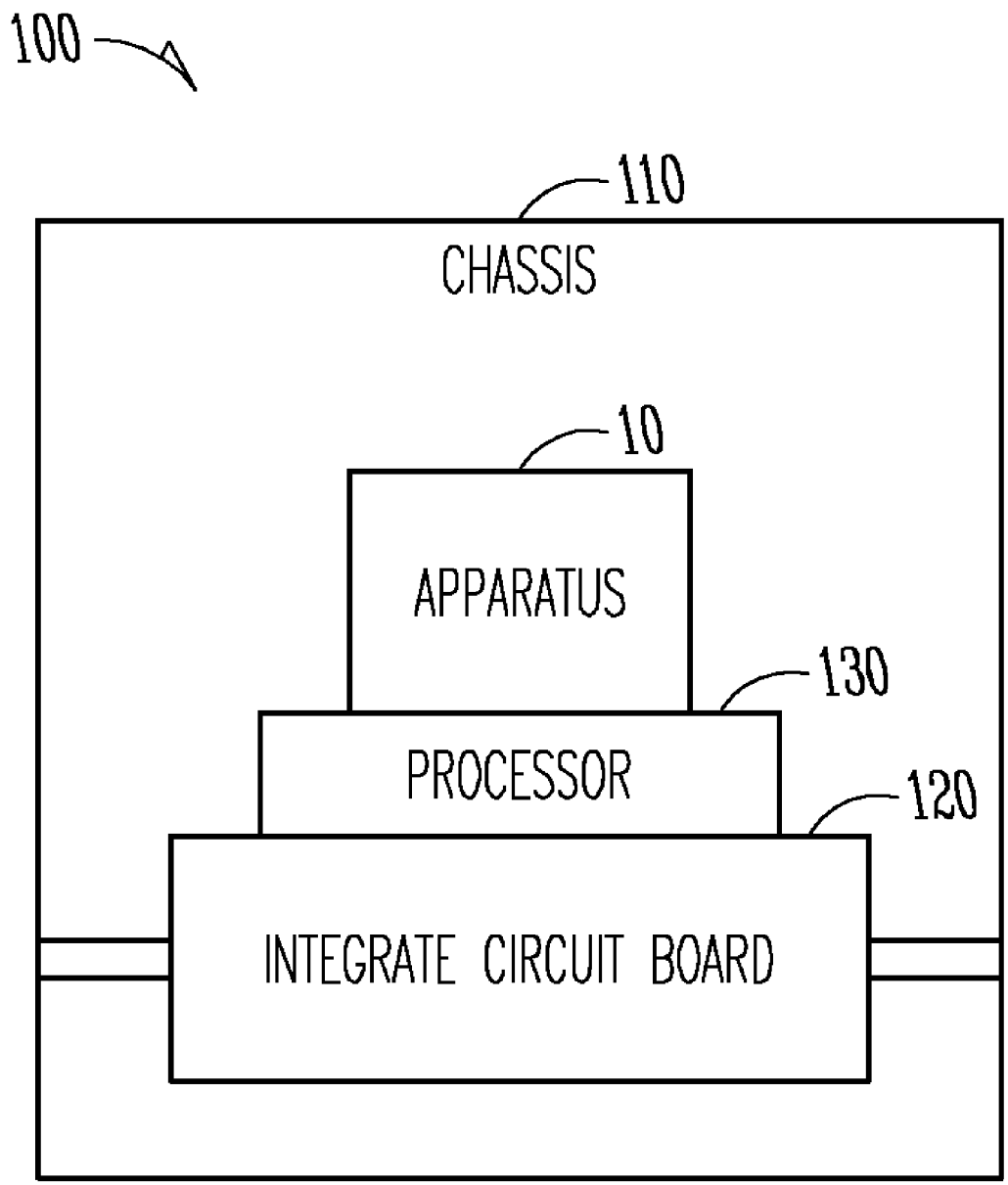
FIG. 5 is a block diagram that illustrates an example system for dissipating heat from an electronic device

FIG. 4 illustrates a situation where the electronic device in which the apparatus 10 is located is oriented such that gravity forces the liquid coolant 30 within the apparatus 10 into contact with the evaporator 14. Although the heater 22 is not needed in this situation to raise the level L of the liquid coolant 30 into contact with the evaporator 14, the control 24 may direct the heater 22 to maintain the temperature of the coolant 30 at an optimum level to facilitate evaporating the liquid coolant 30 within the evaporator 14. The optimum temperature level of the liquid coolant 30 will depend on such factors as (i) the type of evaporator; (ii) the type of coolant; and (iii) the pressure of the liquid coolant as it enters the evaporator.

The invention is not limited to the configurations shown in FIGS. 1-4. Alternate embodiments are contemplated where a pump (see, e.g., pump 31 in FIGS. 1-4) and/or an expansion valve (not shown) are used to adjust the pressure of the coolant 30 prior to condensing and/or evaporating.

The heater 22 may be a resistive coil heater, or any other heater that would efficiently conduct thermal energy to the coolant 30 within the apparatus 10. The apparatus 10 may also include additional heaters to facilitate faster boiling of the coolant 30.

The evaporator 14 is preferably a wick-type evaporator that is thermally connected to the processor 34 via a thermal interface 38. The thermal interface 38 may be a solid piece of copper, or any other interface that would efficiently conduct thermal energy from the processor 34 to the evaporator 14.

Although any coolant 30 could be used without departing from the scope of the present invention, the coolant 30 is preferably water. The closed system is preferably filled with the liquid coolant 30 such that more than 90 percent of the interior volume of the closed system is filled with the liquid coolant 30.

The flexible conduit 26A, 26B is preferably made from plastic, although the conduit may be any material. The flexible conduit 26A, 26B may also be expandable such that the flexible conduit 26A, 26B can be maneuvered in an accordion-like manner.

Using a flexible conduit 26A, 26B facilitates adding the apparatus 10 to an existing computer system without having to modify the computer system because the flexible conduit 26A, 26B may be routed around the existing computer system components. Another advantage associated with using flexible conduit 26A, 26B is that the condenser 18 can be located in a variety of locations relative to the evaporator 14 permitting greater flexibility in the design and layout of integrated circuit boards and other electronic devices.

Alternate embodiments are contemplated that include an evaporator 14 to remove thermal energy from an integrated circuit and a conduit 26B to guide a coolant 30 to the evaporator 14. These alternate embodiments would also include any means to add thermal energy to the coolant 30 such that bubbles 40 form within the coolant 30 to maneuver the coolant 30 into contact with the evaporator 14.

The example embodiments of the apparatus 10 described above may be part of a system 100 that includes a chassis 110. In some embodiments, an integrated circuit board 120 may be mounted in the chassis 110, and one or more electronic devices 130 (e.g., processors) may be coupled to the integrated circuit board 120. The apparatus 10 (i.e., cooling system) may be coupled to the electronic device 130 to cool the electronic device 130.

Another embodiment of the present invention relates to a method of cooling an integrated circuit by adding thermal energy to a coolant 30 and evaporating the coolant 30 within an evaporator 14 to remove thermal energy from the integrated circuit. The method may further comprise (i) condensing the vaporized coolant 30 within a condenser 18 before adding thermal energy to the liquid coolant 30; (ii) pumping the coolant 30 from the evaporator 14 to the condenser 18; and/or (iii) expanding the liquid coolant 30 after condensing the vaporized coolant 30 within the condenser 18.

The method of cooling an integrated circuit may further comprise transporting the coolant 30 between the condenser 18 and the evaporator 14 using the flexible conduit 26A, 26B. One, both or a portion of any conduit used in the apparatus 10 may be flexible without departing from the scope of the present invention.

Another embodiment of the present invention relates to a kit of parts for an electronic device cooling system. The kit may comprise any combination of one or more (i) evaporators 14 that are adapted to be thermally connected to the electronic device such that the evaporator 14 removes thermal energy from the electronic device by evaporating a liquid coolant; (ii) condensers 18 that are adapted to be connected to the evaporators 14 such the condensers 18 condense the coolant 30 that is evaporated by the evaporators 14; and (iii) heaters 22 that are adapted to add thermal energy to the liquid coolant 30 before the liquid coolant 30 is evaporated by the evaporator 14. The kit may also comprise one or more flexible conduits 26A, 26B that are adapted to be coupled to the condenser 18 and the evaporator 14 in order to guide the coolant 30 between any condenser 18 and any evaporator 14. In addition, the kit may include one or pumps (not shown) that are adapted to transport the coolant 30 from the evaporator 14 to the condenser 18.

One of the advantages of assembling a cooling system using a kit of parts as described herein is that a cooling system can be assembled for use with a variety of industry standard integrated circuit boards from a single kit. The cooling system is assembled by selecting the appropriate components based on the space available and the particular thermal situation. The kit also allows the cooling system to be added after the chassis is assembled.

The apparatus and method described above provide a universally applied thermal solution for high heat generating electronic devices. The universal applicability provides thermal engineers with a multitude of options for cooling an electronic device such as a high-powered processor. Many other embodiments will be apparent to those of skill in the art upon reviewing the above description. The scope of the invention should be determined with reference to the appended claims along with the full scope of equivalents to which such claims are entitled.

What is claimed is:

1. A system for dissipating heat from an electronic device, the system comprising:
   a chassis;
   an integrated circuit board mounted in the chassis;
   an electronic device coupled to the integrated circuit board; and
   a cooling system coupled to the electronic device, the cooling system comprising an evaporator that is thermally connected to the electronic device to receive thermal energy from the electronic device, a condenser connected to the evaporator, a coolant cycling between the evaporator where liquid coolant is evaporated to facilitate cooling the electronic device and the condenser where vaporized coolant is condensed into a liquid for subsequent evaporation, a heater that is positioned to supply thermal energy to the coolant, and a pump to transfer the coolant from the condenser to the evaporator.

2. The system of claim 1 further comprising an interface thermally connected to the evaporator to transfer thermal energy from the electronic device to the evaporator.

3. The system of claim 1 further comprising one or more flexible conduits connected to the evaporator and the condenser to transport the coolant between the evaporator and the condenser.

4. The system of claim 1 wherein the evaporator is a wicked evaporator.

5. The system of claim 1 wherein the heater is a resistive coil heater.

6. The system of claim 1 wherein the electronic device is a processor.

7. The system of claim 1 wherein the system is a closed system having an interior volume and the liquid coolant initially occupies more than 90 percent of the interior volume.

8. The system of claim 7 wherein only liquid and vapor coolant occupy the interior volume.

9. A system for dissipating heat from an electronic device, the system comprising:
   a chassis;
   an integrated circuit board mounted in the chassis;
   an electronic device coupled to the integrated circuit board; and
   a cooling system coupled to the electronic device, the cooling system comprising an evaporator that is thermally coupled to the electronic device to receive thermal energy from the electronic device, a condenser, a conduit that provides a closed fluid path between the evaporator and condenser, a liquid coolant within the fluid path, a heater constructed and arranged to supply thermal energy to the liquid coolant, a pump to transfer the liquid coolant from the condenser to the evaporator, and a control that is connected to the heater to maintain the liquid coolant at an optimum temperature for evaporation by the evaporator.

10. The system of claim 9 wherein the evaporator, condenser, pump and conduit define a closed system having an interior volume such that the liquid coolant initially occupies more than 90 percent of the interior volume.

11. The system of claim 9 wherein at least a portion of the conduit is flexible.

12. The system of claim 9 further comprising an interface thermally connected to the evaporator to transfer thermal energy from the electronic device to the evaporator.

13. The system of claim 9 wherein the conduit is a flexible conduit that is connected to the evaporator and the condenser to transport the liquid coolant between the condenser and the evaporator.

14. A system for dissipating heat from an electronic device, the system comprising:
    a chassis;
    an integrated circuit board mounted in the chassis;
    an electronic device coupled to the integrated circuit board; and
    a cooling system coupled to the electronic device, the cooling system comprising an evaporator that is thermally coupled to the electronic device to receive thermal energy from the electronic device, a condenser, a conduit that provides a closed fluid path between the evaporator and condenser, a liquid coolant within the fluid path, a heater constructed and arranged to supply thermal energy to the liquid coolant, and a pump to transfer the liquid coolant from the condenser to the evaporator.

15. The system of claim 14 further comprising an interface thermally connected to the evaporator to transfer thermal energy from the electronic device to the evaporator.

16. The system of claim 14 wherein the conduit is a flexible conduit that is connected to the evaporator and the condenser to transport the liquid coolant between the condenser and the evaporator.

17. The system of claim 14 wherein the evaporator is a wicked evaporator.

18. The system of claim 14 wherein the heater is a resistive coil heater.

19. The system of claim 14 wherein the system is a closed system having an interior volume and the liquid coolant initially occupies more than 90 percent of the interior volume.

20. The system of claim 14 further comprising a control connected to the heater to maintain the liquid coolant at an optimum temperature for evaporation by the evaporator.

* * * * *